(12) United States Patent
Yonge, III et al.

(10) Patent No.: US 7,281,187 B2
(45) Date of Patent: Oct. 9, 2007

(54) USING ERROR CHECKING BITS TO COMMUNICATED AN ADDRESS OR OTHER BITS

(75) Inventors: Lawrence W. Yonge, III, Ocala, FL (US); Srinivas Katar, Ocala, FL (US)

(73) Assignee: Intellon Corporation, Ocala, FL (US)

( * ) Notice: Subject to any disclaimer, the term of this patent is extended or adjusted under 35 U.S.C. 154(b) by 466 days.

(21) Appl. No.: 10/720,016

(22) Filed: Nov. 20, 2003

(65) Prior Publication Data

US 2005/0114749 A1   May 26, 2005

(51) Int. Cl.
    *H03M 13/00* (2006.01)
(52) U.S. Cl. ........................... 714/752; 370/469
(58) Field of Classification Search ............. 711/206
     See application file for complete search history.

(56) References Cited

U.S. PATENT DOCUMENTS

| | | |
|---|---|---|
| 3,806,885 A | 4/1974 | Moore |
| 4,569,044 A | 2/1986 | Tao et al. |
| 4,581,734 A | 4/1986 | Olson et al. |
| 4,630,261 A | 12/1986 | Irvin |
| 4,677,612 A | 6/1987 | Olson et al. |
| 4,682,324 A | 7/1987 | Ulug |
| 4,720,850 A | 1/1988 | Oberlander et al. |
| 4,726,018 A | 2/1988 | Bux et al. |
| 4,792,947 A | 12/1988 | Takiyasu et al. |
| 4,819,229 A | 4/1989 | Pritty et al. |
| 4,881,241 A | 11/1989 | Pommier et al. |
| 4,943,959 A | 7/1990 | Arnold |
| 5,001,472 A | 3/1991 | Fischer et al. |
| 5,003,539 A | 3/1991 | Takemoto et al. |
| 5,046,069 A | 9/1991 | Calvignac et al. |
| 5,081,678 A | 1/1992 | Kaufman et al. |
| 5,105,423 A | 4/1992 | Tanaka et al. |
| 5,121,396 A | 6/1992 | Irvin et al. |

(Continued)

FOREIGN PATENT DOCUMENTS

DE    3413144    10/1985

(Continued)

OTHER PUBLICATIONS

U.S. Appl. No. 09/632.303.

(Continued)

*Primary Examiner*—Guy Lamarre
*Assistant Examiner*—Sam Rizk
(74) *Attorney, Agent, or Firm*—Fish & Richardson P.C.

(57) ABSTRACT

A method of operating in a network in which a plurality of stations communicate over a shared medium. The method comprises transmitting a group of bits from a transmitting station to a receiving station, wherein the group of bits comprises information bits and error checking bits, and communicating additional bits from the transmitting station to the receiving station without transmitting the additional bits. Communicating the additional bits comprises, at the transmitting station, deriving the error checking bits from the additional bits using an error checking process; and at the receiving station, using the same or a related error checking process to process candidate bits known to the receiving station, and comparing the output of the error checking process to the error checking bits received from the transmitting station to determine if the candidate bits correspond to the additional bits.

13 Claims, 5 Drawing Sheets

U.S. PATENT DOCUMENTS

| | | |
|---|---|---|
| 5,140,584 A | 8/1992 | Suzuki |
| 5,157,659 A | 10/1992 | Schenkel |
| 5,197,061 A | 3/1993 | Halbert-Lassalle et al. |
| 5,214,646 A | 5/1993 | Yacoby |
| 5,228,025 A | 7/1993 | Le Floch et al. |
| 5,231,634 A | 7/1993 | Giles et al. |
| 5,274,629 A | 12/1993 | Helard et al. |
| 5,280,480 A | 1/1994 | Pitt et al. |
| 5,307,376 A | 4/1994 | Castelain et al. |
| 5,339,313 A | 8/1994 | Ben-Michael et al. |
| 5,343,473 A | 8/1994 | Cidon et al. |
| 5,384,777 A | 1/1995 | Ahmadi et al. |
| 5,416,801 A | 5/1995 | Chouly et al. |
| 5,426,646 A | 6/1995 | Slack |
| RE35,001 E | 7/1995 | Grow |
| 5,432,848 A | 7/1995 | Butter et al. |
| 5,436,905 A | 7/1995 | Li et al. |
| 5,448,565 A | 9/1995 | Chang et al. |
| 5,452,288 A | 9/1995 | Rahuel et al. |
| 5,452,322 A | 9/1995 | Lauer |
| 5,473,602 A | 12/1995 | McKenna et al. |
| 5,481,535 A | 1/1996 | Hershey |
| 5,483,529 A | 1/1996 | Baggen et al. |
| 5,488,632 A | 1/1996 | Mason et al. |
| 5,504,747 A | 4/1996 | Sweazey |
| 5,515,379 A | 5/1996 | Crisler et al. |
| 5,524,027 A | 6/1996 | Huisken |
| 5,537,414 A | 7/1996 | Takiyasu et al. |
| 5,541,922 A | 7/1996 | Pyhalammi |
| 5,548,649 A | 8/1996 | Jacobson |
| 5,555,268 A | 9/1996 | Fattouche et al. |
| 5,561,770 A * | 10/1996 | de Bruijn et al. ............ 709/225 |
| 5,563,883 A | 10/1996 | Cheng |
| 5,563,897 A | 10/1996 | Pyndiah et al. |
| 5,568,476 A | 10/1996 | Sherer et al. |
| 5,610,908 A | 3/1997 | Shelswell et al. |
| 5,612,975 A | 3/1997 | Becker et al. |
| 5,615,212 A | 3/1997 | Ruszczyk et al. |
| 5,619,651 A | 4/1997 | Young |
| 5,623,512 A | 4/1997 | Sasaki |
| 5,627,829 A | 5/1997 | Gleeson et al. |
| 5,629,948 A | 5/1997 | Hagiwara et al. |
| 5,636,230 A | 6/1997 | Marturano et al. |
| 5,644,576 A | 7/1997 | Bauchot et al. |
| 5,651,009 A | 7/1997 | Perreault et al. |
| 5,694,389 A | 12/1997 | Seki et al. |
| 5,706,348 A | 1/1998 | Gray et al. |
| 5,717,689 A | 2/1998 | Ayanoglu |
| 5,732,113 A | 3/1998 | Schmidl et al. |
| 5,737,330 A | 4/1998 | Fulthorp et al. |
| 5,745,769 A | 4/1998 | Choi |
| 5,757,766 A | 5/1998 | Sugita |
| 5,757,770 A | 5/1998 | Lagoutte et al. |
| 5,764,931 A | 6/1998 | Schmahl et al. |
| 5,771,235 A | 6/1998 | Tang et al. |
| 5,787,071 A | 7/1998 | Basso et al. |
| 5,790,541 A | 8/1998 | Patrick et al. |
| 5,793,307 A | 8/1998 | Perreault et al. |
| 5,799,033 A | 8/1998 | Baggen |
| 5,812,599 A | 9/1998 | Van Kerckhove |
| 5,818,821 A | 10/1998 | Schurig |
| 5,818,826 A | 10/1998 | Gfeller et al. |
| 5,825,807 A | 10/1998 | Kumar |
| 5,828,677 A | 10/1998 | Sayeed et al. |
| 5,841,778 A | 11/1998 | Shaffer et al. |
| 5,841,873 A | 11/1998 | Lockhart et al. |
| 5,884,040 A | 3/1999 | Chung |
| 5,886,993 A | 3/1999 | Ruszczyk et al. |
| 5,892,769 A | 4/1999 | Lee |
| 5,896,561 A | 4/1999 | Schrader et al. |
| 5,903,614 A | 5/1999 | Suzuki et al. |
| 5,914,932 A | 6/1999 | Suzuki et al. |
| 5,914,959 A | 6/1999 | Marchetto et al. |
| 5,940,399 A | 8/1999 | Weizman |
| 5,940,438 A | 8/1999 | Poon et al. |
| 5,948,060 A | 9/1999 | Gregg et al. |
| 5,956,338 A | 9/1999 | Ghaibeh |
| 5,966,412 A | 10/1999 | Ramaswamy |
| 5,970,062 A | 10/1999 | Bauchot |
| 5,987,011 A | 11/1999 | Toh |
| 6,005,894 A | 12/1999 | Kumar |
| 6,006,017 A | 12/1999 | Joshi et al. |
| 6,041,063 A | 3/2000 | Povlsen et al. |
| 6,041,358 A | 3/2000 | Huang et al. |
| 6,044,154 A | 3/2000 | Kelly |
| 6,044,482 A | 3/2000 | Wong |
| 6,052,377 A | 4/2000 | Ohmi et al. |
| 6,076,115 A | 6/2000 | Sambamurthy et al. |
| 6,092,214 A | 7/2000 | Quoc et al. |
| 6,097,703 A | 8/2000 | Larsen et al. |
| 6,098,179 A | 8/2000 | Harter, Jr. |
| 6,108,713 A | 8/2000 | Sambamurthy et al. |
| 6,125,150 A | 9/2000 | Wesel et al. |
| 6,130,887 A | 10/2000 | Dutta |
| 6,130,894 A | 10/2000 | Ojard et al. |
| 6,151,296 A | 11/2000 | Vijayan et al. |
| 6,169,744 B1 | 1/2001 | Grabelsky et al. |
| 6,182,147 B1 | 1/2001 | Farinacci |
| 6,188,717 B1 | 2/2001 | Kaiser et al. |
| 6,192,397 B1 | 2/2001 | Thompson |
| 6,202,082 B1 | 3/2001 | Tomizawa et al. |
| 6,215,792 B1 | 4/2001 | Abi-Nassif |
| 6,216,244 B1 | 4/2001 | Myers et al. |
| 6,222,851 B1 | 4/2001 | Petry |
| 6,243,386 B1 | 6/2001 | Chan et al. |
| 6,243,449 B1 | 6/2001 | Margulis et al. |
| 6,246,770 B1 | 6/2001 | Stratton et al. |
| 6,252,849 B1 | 6/2001 | Rom et al. |
| 6,259,696 B1 | 7/2001 | Yazaki et al. |
| 6,263,445 B1 | 7/2001 | Blumenau |
| 6,278,685 B1 | 8/2001 | Yonge, III et al. |
| 6,278,716 B1 | 8/2001 | Rubenstein et al. |
| 6,279,716 B1 | 8/2001 | Kayatani et al. |
| 6,289,000 B1 | 9/2001 | Yonge, III |
| 6,295,296 B1 | 9/2001 | Tappan |
| 6,334,185 B1 | 12/2001 | Hansson et al. |
| 6,343,083 B1 | 1/2002 | Mendelson et al. |
| 6,363,052 B1 | 3/2002 | Hosein |
| 6,370,156 B2 | 4/2002 | Spruyt et al. |
| 6,385,672 B1 | 5/2002 | Wang et al. |
| 6,397,368 B1 | 5/2002 | Yonge, III et al. |
| 6,421,725 B1 | 7/2002 | Vermilyea et al. |
| 6,430,192 B1 | 8/2002 | Creedon et al. |
| 6,430,661 B1 | 8/2002 | Larson et al. |
| 6,434,153 B1 | 8/2002 | Yazaki et al. |
| 6,442,129 B1 | 8/2002 | Yonge, III et al. |
| 6,445,717 B1 | 9/2002 | Gibson et al. |
| 6,456,649 B1 | 9/2002 | Isaksson et al. |
| 6,466,580 B1 | 10/2002 | Leung |
| 6,469,992 B1 | 10/2002 | Schieder |
| 6,473,435 B1 | 10/2002 | Zhou et al. |
| 6,480,489 B1 | 11/2002 | Muller et al. |
| 6,487,212 B1 | 11/2002 | Erimli et al. |
| 6,501,760 B1 | 12/2002 | Ohba et al. |
| 6,519,263 B1 | 2/2003 | Huth |
| 6,526,451 B2 | 2/2003 | Kasper |
| 6,538,985 B1 | 3/2003 | Petry et al. |
| 6,553,534 B2 | 4/2003 | Yonge, III et al. |
| 6,567,914 B1 | 5/2003 | Just et al. |
| 6,654,410 B2 | 11/2003 | Tzannes |
| 6,667,991 B1 | 12/2003 | Tzannes |
| 6,671,284 B1 | 12/2003 | Yonge, III et al. |
| 6,747,976 B1 | 6/2004 | Bensaou et al. |
| 6,765,885 B2 | 7/2004 | Jiang et al. |

| | | | |
|---|---|---|---|
| 6,778,507 B1 | 8/2004 | Jalali | |
| 6,782,503 B1* | 8/2004 | Dawson | 714/739 |
| 6,789,128 B1 | 9/2004 | Harrison et al. | |
| 6,882,637 B1 | 4/2005 | Le et al. | |
| 7,047,453 B2* | 5/2006 | Lappin, Jr. | 714/52 |
| 2001/0012319 A1 | 8/2001 | Foley | |
| 2001/0043576 A1 | 11/2001 | Terry | |
| 2001/0048692 A1 | 12/2001 | Karner | |
| 2002/0001314 A1 | 1/2002 | Yi et al. | |
| 2002/0012320 A1 | 1/2002 | Ogier et al. | |
| 2002/0042836 A1 | 4/2002 | Mallory | |
| 2002/0048368 A1 | 4/2002 | Gardner | |
| 2002/0065047 A1 | 5/2002 | Moose | |
| 2002/0131591 A1 | 9/2002 | Henson et al. | |
| 2002/0191533 A1 | 12/2002 | Chini et al. | |
| 2003/0006883 A1 | 1/2003 | Kim et al. | |
| 2003/0079169 A1 | 4/2003 | Ho et al. | |
| 2003/0174664 A1 | 9/2003 | Benveniste | |
| 2003/0217182 A1 | 11/2003 | Liu et al. | |
| 2003/0231652 A1 | 12/2003 | Sprague et al. | |
| 2003/0231658 A1 | 12/2003 | Liang et al. | |
| 2004/0001499 A1 | 1/2004 | Patella et al. | |
| 2004/0008728 A1 | 1/2004 | Lee | |
| 2004/0184481 A1 | 9/2004 | Lee | |
| 2005/0122994 A1 | 6/2005 | Manglin et al. | |
| 2006/0041734 A1* | 2/2006 | Lim et al. | 711/206 |

FOREIGN PATENT DOCUMENTS

| | | |
|---|---|---|
| WO | 98/57440 | 12/1998 |
| WO | WO2000/72495 | 11/2000 |
| WO | 02/41598 | 5/2002 |

OTHER PUBLICATIONS

Sun et al., Public-key ID-based Cryptosystem, 1991, IEEE, pp. 142-144.

Bruschi, Danilo, Secure Multicast in Wireless Networks of Mobile Hosts: Protocols and Issues, 2002, Mobile Networks and Applications, pp. 503-511.

IBM, Combined use of collision resolution and collision avoidance MAC protocols, Oct. 1, 1994, IBM Technical Disclosure Bulletin, vol. 37, pp. 299-302 (NN9410299).

ISO/IEC 8802-3: 2002 International Standard (ANSI/IEEE Std 802.3) Carrier sense multiple access with collision detection (CSMA/CD) access method and physical layer specifications.

ISO/IEC 8802-11: 1999 International Standard (ANSI/IEEE Std 802.11) Wireless LAN Medium Access Control (MAC) and Physical Layer (PHY) specifications.

Shared Wireless Access Protocol (Cordless Access) Specification, SWAP-CA Revision 1.21, Jan. 27, 1999, by the HomeRF™ Technical Committee.

Interface Specification for HomePNA ™ 2.0 - 10M8 Technology, Dec. 01, 1999.

Interface Specification for HomePNA ™ 2.0 - 10M8 Technology—Link Layer Protocols, Dec. 01, 1999.

Bux, "Token-Ring Local-Area Networks and Their Performance," Procs. Of the IEEE, vol. 77, No. 2, Feb. 1989.

Applied Cryptography, Second Edition: protocols, algorithms, and source code in C, Bruce Schneier, 1996.

PKCS #5 v. 20: Password-Based Cryptography Standard, RSA Laboratories, Mar. 25, 1999.

HomePlug Powerline Alliance, HomePlug 1.0.1 Specification, Dec. 1, 2001.

Lee et al., "HomePlug 1.0 powerline communication LANs—protocol description and performance results", Int. J. Commun. Syst., vol. 16 (2003).

Carrier sense multiplie access with collision detection (CSMA/CD) access method and physical layer specifications, ISO/IEC 8802-3: 1996 International Standard (ANSI/IEEE Std 802.3).

Bertsekas et al., Data Networks, Prentice Hall, Englewood Cliffs, NJ, Section 2.4.3 Selective Repeat ARQ (1992).

HiPerformance Radio Local Area Network (HiperLAN) Type I: Functional Specification, European Standard (Telecommunication Series) No. 300652 V. 1.2.1 1998-07.

An Architecture for Differentiated Services, IETF RFC 2475, Dec. 1998.

Goalic et al., "Real-Time Turbo-Decoding of Product Codes on a Digital Signal Processor," IEEE, pp. 624-628 (1997).

Benedetto et al., "A Soft-Input Soft-Output Maximum A Posteriori (MAP) Module to Decode Parallel and Serial Concatenated Codes," TDA Progress Report 42-127, pp. 1-20 (Nov. 1996).

Peterson et al., "Error-Correcting Codes," The MIT Press (1972).

Pyndiah, "Near-Optimum Decoding of Product Codes: Block Turbo Codes," IEEE Transactions on Communications, vol. 46, No. 8, pp. 1003-1010 (Aug. 1998).

Pyndiah, "Near Optimum Decoding of Product Codes," IEEE, pp. 339-343 (1994).

Pyndiah, "Performance of Block Turbo Coded 16-QAM and 64-QAM Modulations," IEEE, pp. 1039-1043 (1995).

Ehrsam et al., "A cryptographic key management scheme for implementing the Data Encryption Standard," IBM Syst J, vol. 17, No. 2 (1978).

Kamerman, A; Aben, G; Net throughput with IEEE 802.11 wireless LANs; Wireless Communications and Networking Conference, 2000. WCNC 2000 IEEE, vol. 2, Sep. 23-28, 2000; pp. 747-752.

Dube, P.; Altman, E.; Queueing analysis of early message discard policy; Communications, 2002. ICC 2002. IEEE International conference, vol. 4, Iss., 2002, pp. 2426-2430.

* cited by examiner

USING ERROR CHECKING BITS TO COMMUNICATED AN ADDRESS OR OTHER BITS

TECHNICAL FIELD

This invention relates to network communications.

BACKGROUND

Networks where multiple stations share a common medium require stations to coordinate access to the medium. A variety of protocols like Carrier Sense Multiple Access (CSMA), Token passing and Polling are used to achieve coordinate medium access. Stations in multiple access networks exchange data using structured protocol entities called packets. These packets carry addressing information required to identify the source and destination of the transmission. Typically, each station in the network is identified by a unique address. These addresses are sent in packets to uniquely identify the source and destination.

Certain network situations may require stations to broadcast these addresses. This can be costly in some networks where broadcasting is inefficient and the addresses are large.

SUMMARY

In one aspect, the invention features a method of operating in a network in which a plurality of stations communicate over a shared medium. The method comprises transmitting a group of bits from a transmitting station to a receiving station, wherein the group of bits comprises information bits and error checking bits, and communicating additional bits from the transmitting station to the receiving station without transmitting the additional bits. Communicating the additional bits comprises, at the transmitting station, deriving the error checking bits from the additional bits using an error checking process; and at the receiving station, using the same or a related error checking process to process candidate bits known to the receiving station, and comparing the output of the error checking process to the error checking bits received from the transmitting station to determine if the candidate bits correspond to the additional bits.

Embodiments may include one or more of the following. The communicating of the additional bits may further comprise, at the transmitting station, deriving the error checking bits from the additional bits and the information bits using the error checking process, and at the receiving station, using the same or a related error checking process to process the candidate bits and the information bits received from the transmitting station, comparing the output of the error checking process result to the error checking bits received from the first station to determine if the candidate bits correspond to the additional bits. The additional bits may comprise an address identifying one or both of the transmitting and receiving stations. The group of bits may constitute a packet, the information bits may comprise a source address and data, and the additional bits may comprise a destination address identifying the receiving station. The group of bits may constitute a packet, the information bits may comprise a source address and data, and the additional bits may comprise at least a portion of a destination address at least partially identifying the receiving station. The group of bits may constitute a Request To Send (RTS), the information bits may comprise a source address and data, with the source address identifying the transmitting station, and the additional bits may comprise a destination address identifying the receiving station. The group of bits may constitute a RTS, the information bits may comprise a source address and data, with the source address identifying the transmitting station, and the additional bits may comprise at least a portion of a destination address at least partially identifying the receiving station. The group of bits may constitute a Clear To Send (CTS) transmitted in response to an RTS, and the additional bits may comprise one or both of the following: (1) a destination address identifying the receiving station and (2) a source address identifying the transmitting station. The group of bits may constitute an acknowledgement and the additional bits may comprise one or both of the following: (1) a source address identifying the transmitting station and (2) a destination address identifying the receiving station. The group of bits may constitute an acknowledgement and the additional bits may comprise one or both of the following: (1) at least a portion of a source address at least partially identifying the transmitting station and (2) at least a portion of a destination address at least partially identifying the receiving station. The group of bits may constitute an acknowledgement transmitted in response to a receipt of a packet, and the additional bits may comprise a set of bits from the packet that is sufficiently unique as to associate the acknowledgement with the packet. The information bits may comprise bits indicating which portions of a previously transmitted packet need to be retransmitted. The error checking process may comprise a cyclic redundancy check, and the error checking bits may comprise frame check sequence (FCS) bits associated with the cyclic redundancy check.

and the error checking bits may comprise frame check sequence (FCS) bits associated with the cyclic redundancy check.

In another aspect, the invention features a method of operating in a network in which a plurality of stations communicate over a shared medium that includes transmitting a group of bits from a transmitting station to a receiving station, wherein the group of bits comprises information bits and a substantially unique number. The method also includes acknowledging receipt of the group of bits at the receiving station by transmitting an acknowledgement containing the substantially unique number or number or containing data from which the substantially unique number can be derived.

Embodiments may include one or more of the following. The group of bits may include a destination address identifying the receiving station, and the acknowledgement may include the same destination address. The transmitting station may receive the acknowledgement and may determine whether it contains the same destination address and the same substantially unique number as included in the transmitted group of bits. The group of bits may constitute an RTS and the acknowledgement may constitute a CTS. The substantially unique number may comprise a pseudorandom number.

These and other embodiments may have one or more of the following advantages. Packets may be transmitted and received by the intended destinations without requiring the transfer of complete source and destination addresses. This can be used to improve packet efficiency. For example, standard error checking techniques can be used to encode source and destination address information in packets without explicitly transmitting the source and destination address information. Various types of error checking techniques may be used, including cyclic redundancy code checking as well as checksum. For Request to Send (RTS) and Clear to Send (CTS), the communication overhead is reduced by not requiring transferring both source and destination addresses in the RTS message.

The details of one or more embodiments of the invention are set forth in the accompanying drawings and the description below. Other features, objects, and advantages of the invention will be apparent from the description and drawings, and from the claims.

DETAILED DESCRIPTION

There are a great many possible implementations of the invention, too many to describe herein. Some possible implementations that are presently preferred are described below and in the Appendix. It cannot be emphasized too strongly, however, that these are descriptions of implementations of the invention, and not descriptions of the invention, which is not limited to the detailed implementations described in this section but is described in broader terms in the claims.

Figure 1:
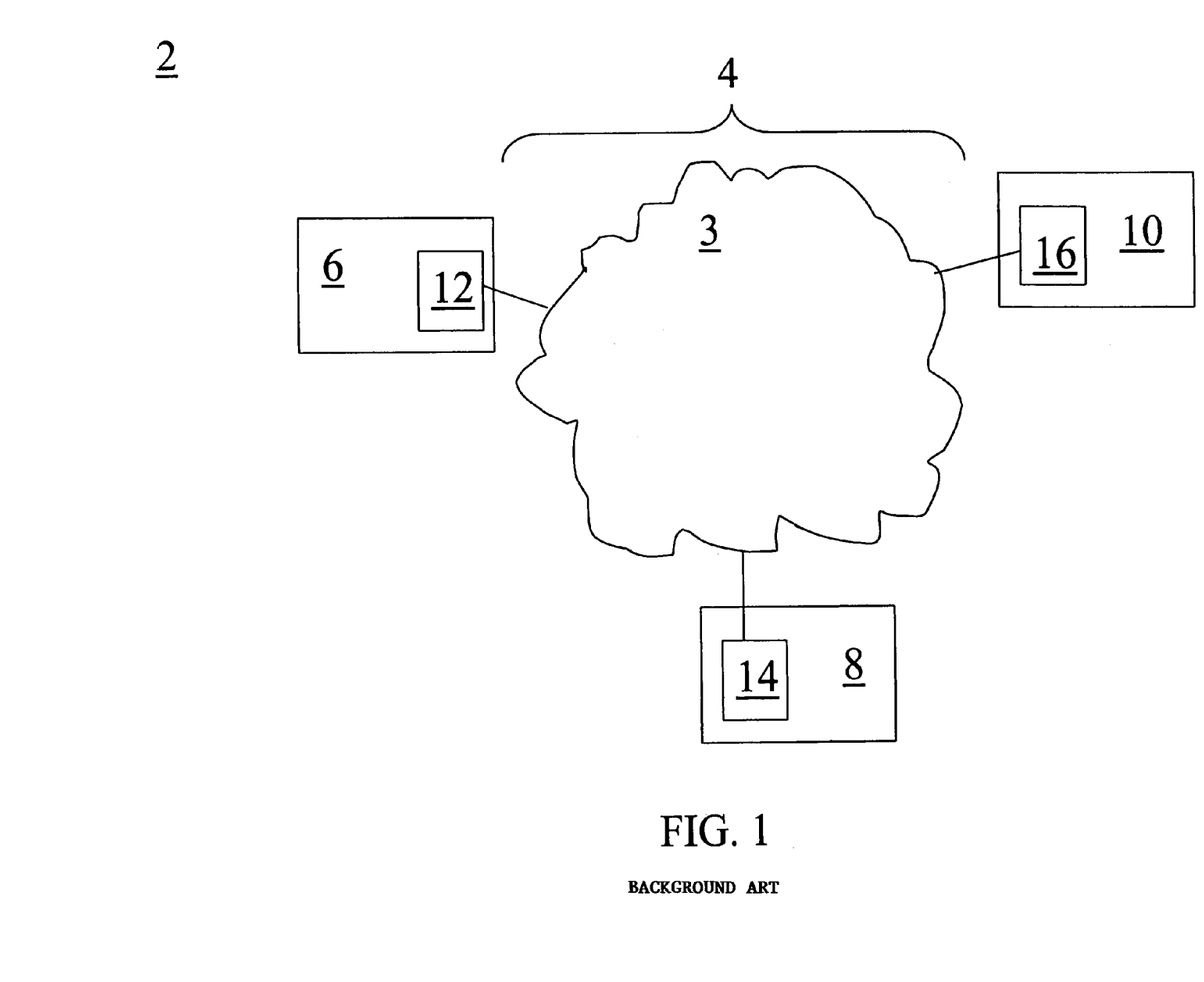
FIG. 1 is a schematic of a network configuration.

As shown in FIG. 1, network configuration 2 includes communications medium 3 and network 4 in which electronic devices 6, 8, and 10 (e.g., audiovisual equipment) communicate over medium 3. Electronic devices 6, 8, and 10 include media access controllers (MAC) 12, 14, and 16 that manage communication access to the network 4 for electronic devices 6, 8, and 10, respectively. MACs 12, 14, and 16 implement the data link layer and connect to the physical layer of the Open Systems Interconnection (OSI) network architecture standard. In a general sense, MACs 12, 14, and 16 represent stations on network 4 that send messages to one another over medium 3. Communications medium 3 is a physical communication link between electronic devices 6, 8, and 10, and may include optical fiber, coaxial cable, unshielded twisted pair, in addition to other media such as power lines. Electronic devices 6, 8, and 10 communicate with one another based on requirements of software applications running on electronic devices 6, 8, and 10. This communication creates traffic of messages on network 4.

In some examples, medium 3 has a limited bandwidth due to limited physical capacity or electronic noise. Messages (e.g., groups of bits such as packets or ACKs) sent between MACs include at least some information bits (e.g., packet body, payload, frame control information, addresses). Some messages between MACs 12, 14, and 16 also convey additional bits of information (e.g., a destination address) without sending the additional bits. The additional bits are conveyed by deriving error checking bits (e.g., CRC or checksum) from the additional bits at the transmitting station, transmitting the error checking bits with the information bits, and then using an error checking process at a receiving station to derive error checking bits from candidate bits (e.g. the receiving station's address). If the error checking bits derived at the receiving station compare favorably (e.g., match) to the received error checking bits, then the receiving station can safely conclude that the candidate bits are the same as the additional bits used by the transmitter (e.g., that the destination address is the receiver's address).

Communication error checking can be done in various ways. E.g., a transmitting station may use an error checking process to encode a block of data to be transmitted into a substantially unique code (which could be termed error checking bits) that is substantially unique to the communication and send the unique code along with the block of data to a receiving station. The receiving station then processes the received block of data and unique code using the same or related error checking process to determine whether the received block of data has been received without error. Common error checking processes include cyclic redundancy code (CRC) checking and checksum.

Cyclic redundancy code (CRC) checking is a method of checking for errors in data that have been transmitted on a communications link. For example, a transmitting station (e.g., MAC 12) in network configuration 2 typically applies a 8-, 16- or 32-bit polynomial to a block of data that is to be transmitted to a receiving station (e.g., MAC 14) and appends the resulting cyclic redundancy code to the block. The receiving station (e.g., MAC 14) applies the same polynomial to the data and each receiving station compares its result with the result appended by the transmitting station. If the result matches with the appended CRC, the receiving station can assume that the block of data has been received successfully.

Another typical error detection method for communication is the checksum method. A sum of data in a transmitted block (the checksum) is transmitted with the block of data so that the receiving station can compare a sum of the received block data with the received sum. If the sums match, then the receiving station can assume that the transmission of the block of data was correctly received.

MACs 12, 14, and 16 convey a block of data (information bits, e.g., a packet body or payload) as well as extra information (additional bits, e.g., a destination address) without using substantially more bandwidth than would have been necessary for conveying the block of data. This is accomplished by deriving error checking bits from the extra information and the block of data but actually transmitting only the block of data and the error checking bits (alternatively, some portion, but not all, of the extra information might be transmitted). Although the extra information is not transmitted, each station (e.g., MACs 14 and 16) receiving the message can perform an error checking process using candidate bits (e.g., the receiving station's address) to test whether the candidate bits correspond to the extra information (e.g., whether the receiving station's address matches the destination address). The receiving station may accomplish this by appending the candidate bits (e.g., its address) to the received block of data message, and then applying the error checking process (the same one as used in the transmitter, or a related on that should produce a result from which it can be determined whether the candidate bits compare favorably to the additional bits). Various types of extra information (additional bits) can be conveyed in this manner, e.g., destination or source addresses, identification of a packet, or other information from a finite universe of information known to the receiving station.

Figure 2:
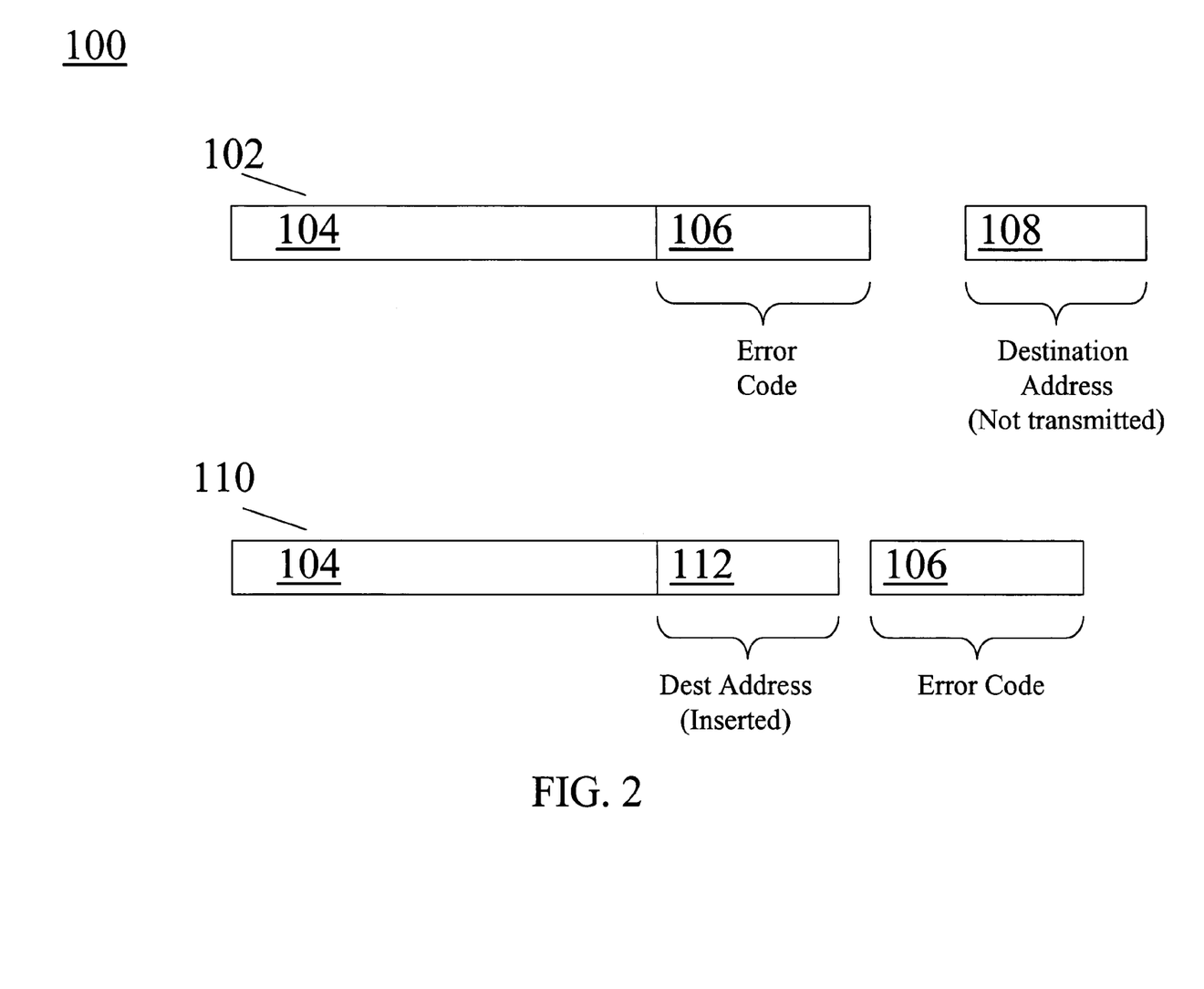
FIGS. 2–5 are data structure diagrams of transmitted and received data.

As shown in FIG. 2, MAC 12 has a task of sending a message frame 102 with a block of data 104 to MAC 14 via medium 3 without directly specifying a destination address 108 for MAC 14. Both MAC 14 and MAC 16 will receive the message and MAC 14 should behave as if the message 102 is intended for MAC 14 while MAC 16 should function as if the message frame 102 is not intended for MAC 16. In the message frame 102, MAC 12 sends block of data 104 and error checking code 106. MAC 12 generates the error checking code 106 as if the block of data 104 were sent with the address 108 for MAC 14. Upon receipt of the message frame 102, MAC 14 determines that the message frame 102 is intended for MAC 14, and MAC 16 determines that the message is not intended for MAC 16. MAC 14 and MAC 16 make this determination by inserting each receiving station's address 112 into an augmented message 110 (containing the received block of data and the receiving station's address) and using error checking code 106 against the augmented message 110 to check for errors. If there are no errors using this augmented message 110, then the inserted address 112 is assumed to be the destination address 108. In this example, MAC 14 has no errors and MAC 16 has errors.

Figure 3:
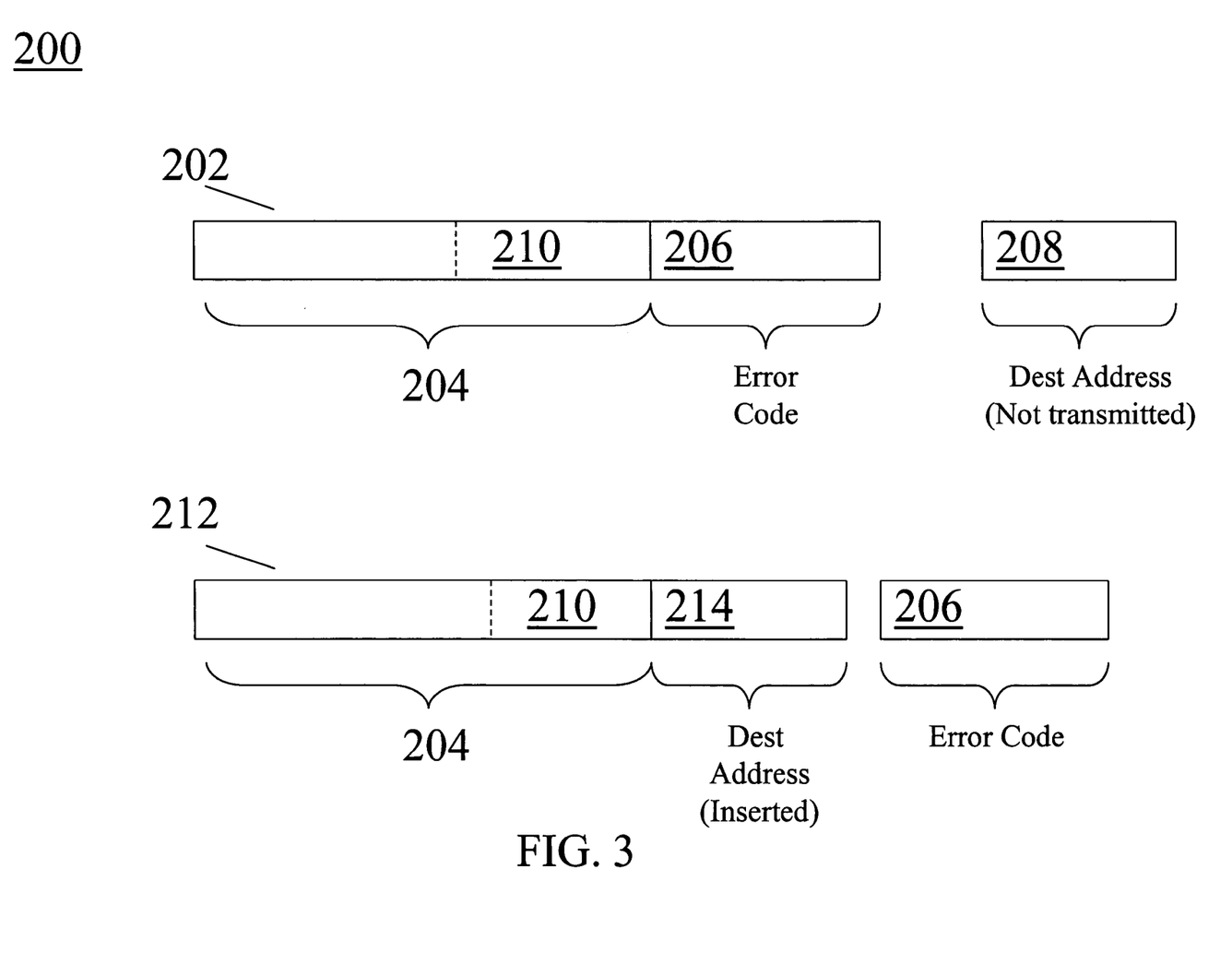

Another example of matching some information in the message with an address of the receiving MAC occurs when MACs 12, 14, and 16 send Request to Send/Clear to Send (RTS/CTS) message pairs between each other. RTS/CTS is used when a MAC (e.g., 12) needs to know that another MAC (e.g., 14) is listening before sending data. As shown in FIG. 3, MAC 12 sends a RTS message frame 202 to medium 3 to check if MAC 14 is listening before MAC 12 sends data to MAC 14. In this example, the RTS message frame 202 includes a data portion 204 and an error code 206 for error checking at the receiving station (e.g., MAC 14). In one example, the error code 206 is a CRC resulting from applying a 8-, 16- or 32-bit polynomial to the data portion 204. The data portion 204 includes a source address 210 of MAC 12, but not a destination address 208. MACs 14 and 16 receive the RTS message on medium 3. Both MAC 14 and 16 read the data portion 204 and the error code 206 of the message 202. In the example where error code 206 is a CRC, both MAC 14 and 16 apply the 8-, 16- or 32-bit polynomial to an augmented message 212 representing the combination of the received data portion 204 and address 214 of either MAC 14 or 16. Both MAC 14 and 16 check for errors using the augmented message 212. MAC 14 finds no error in the augmented message 212 so MAC 14 detects that the RTS message is intended for MAC 14. By making this successful match, MAC 14 not only knows that the RTS message 202 is intended for MAC 14 but also that the message was received without transmission errors. MAC 14 responds to the RTS by sending a CTS message to medium 3 with MAC 12 as its intended recipient without including address 210 of MAC 12 in the message body. The CTS message has an error code that is derived from the data portion of the CTS message in addition to the destination address 210 of MAC 12. Alternatively, the CTS message can use one or both of the source address (address of station generating the CTS) and destination address (address of station that is the intended recipient of the CTS) in the CRC computation. MACs 12 and 16 receive the CTS message on medium 3 and MAC 12 detects that the CTS message is intended for MAC 12 by augmenting the message with its address 210 and calculating that the augmented message is error free as described previously.

Figure 4:
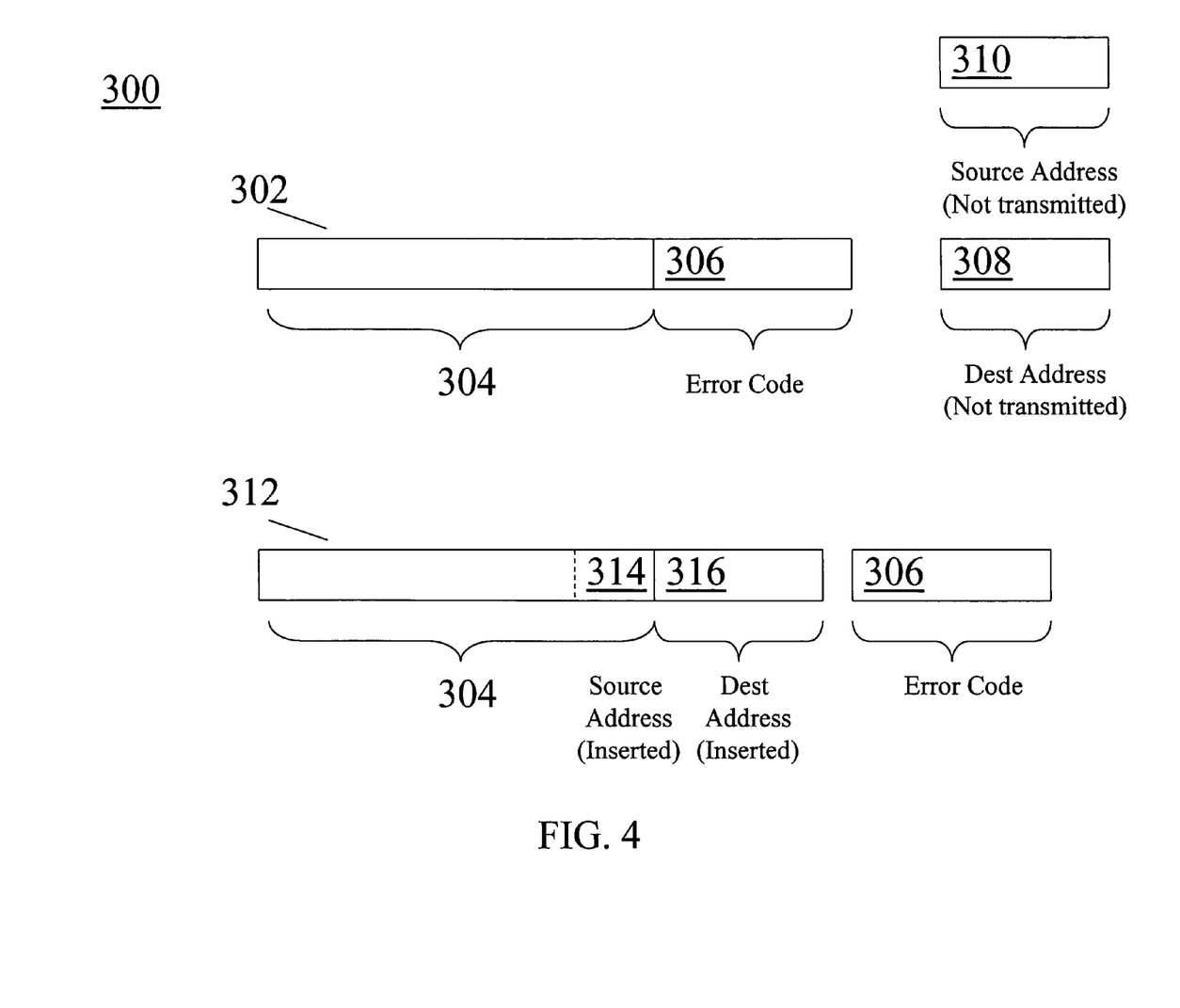

Other applications of this messaging technique include packet acknowledgement so that a transmitting station knows when its packets have been received or not. As shown in FIG. 4, MAC 12 sends a message frame 302 containing an acknowledgement of a receipt of a packet. MAC 14 originally sent the packet to MAC 12 so the packet acknowledgement conveys a source address identification 310 for MAC 12. Upon receipt of this acknowledgement, MAC 14 can match the acknowledgement to a packet sent by MAC 14 to MAC 12. The acknowledgement message 302 is intended for MAC 14 but both MAC 14 and 16 receive the message 302 on medium 3. MAC 12 generates the message 302 by generating error code 306 as if the source address 310 (address of MAC 12) and the destination address 308 (address of MAC 14) were part of a block of data for the message 302 without transmitting the source address 310 and the destination address 308. Alternatively, the acknowledgement can also use only the destination address or only the source address in the CRC computation. The intended receiver knows the address of the station that is supposed to send the response, and thus the acknowledgment mechanism can use one or both of the destination address and source address. Upon receipt of the message, both MAC 14 and MAC 16 insert their addresses into an augmented message 312 as potential destination address 316. Both MAC 14 and MAC 16 also insert addresses into an augmented message 312 of stations where MAC 14 and 16 previously sent unacknowledged packets as potential source addresses 314. MAC 14 and 16 then check their augmented messages 312 against the received error code 306 in the message to see if there is a match. In this case, MAC 14 has a match for the destination address 316 and a source address 314 for the packet previously sent to MAC 12.

Figure 5:
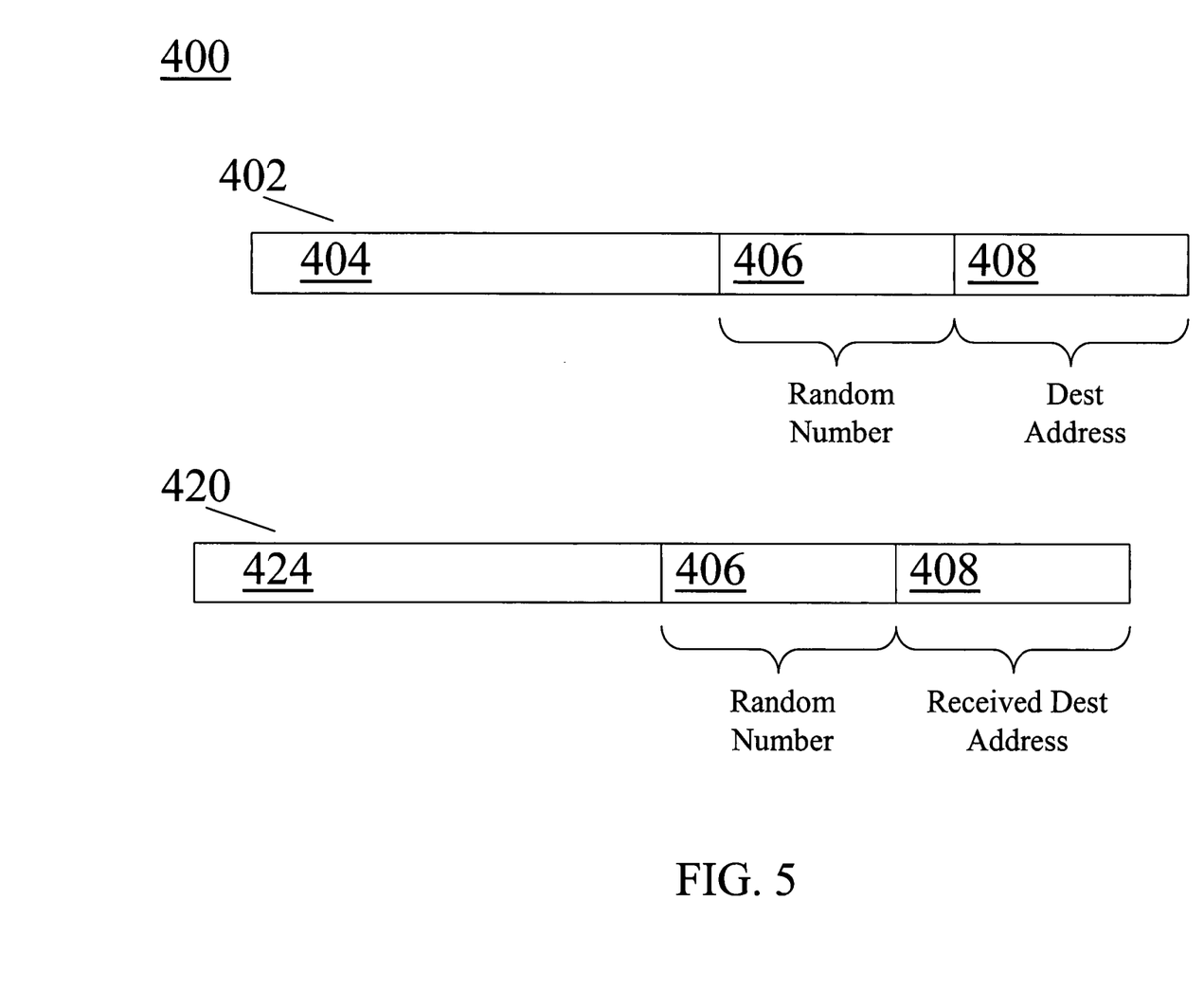

FIG. 5 shows one possible implementation of a communication method in which a substantially unique number (e.g., a pseudorandom number) is transmitted along with block of data, and a receiving station acknowledges receipt of the block of data by transmitting an acknowledgement containing the substantially unique number or containing data from which the substantially unique number can be derived. As described previously, MAC 12 wishes to determine if data can be sent to MAC 14. As shown in FIG. 5, MAC 12 sends a RTS message 402 to MAC 14 with a substantially unique number 406, such as a pseudorandomly generated number, along with an address 408 of MAC 14 and other data 404. In response, MAC 14 sends back a CTS message 420 to MAC 12 with the same substantially unique number 406 and the address 408 of MAC 14 along with other data. Upon receipt of the CTS message 420, MAC 12 knows that it has received a CTS message corresponding to its RTS message 402 by a correct match of its original substantially unique number 406 and the received substantially unique number as well as the address 408 of MAC 12. Subsequently, MAC 12 can send data to MAC 14. In an alternative implementation a different number is returned, one that is derived by transforming number 406, but MAC 12 is aware of the transformation, and is able to ascertain that the returned number was derived from the number 406.

The normal cyclic redundancy code algorithm is typically as follows. First, a CRC is determined to be some number n bits long. To generate the CRC for a block of data, a transmitting station (e.g., MAC 12) left shifts the frame representing the block of data by n bits and then divides it by a predefined polynomial P. P is n+1 bits long. The remainder of the division is the FCS. MAC 12 appends the FCS to the frame representing the block of data. The result is the final frame forming the message body to transmit. On the receiving side, a receiving station (e.g., MAC 14) receives the frame. MAC 14 then divides the frame by the predefined polynomial P. If the remainder of the division is zero then the transmission is error free. If the transmission is not zero then there is an error in the transmission.

Several different length CRCs are used in network configuration 2 by MACs 12, 14, and 16 to match destination addresses and check for errors using correct demodulation or decryption of data. Different lengths of these CRCs include CRC-8, CRC-16, and CRC-24.

The CRC-8 is calculated using the following standard generator polynomial of degree 8: $G(x)=x^8+x^2+x+1$. The CRC-8 is the one's complement of the (modulo-2) sum of the following:

The remainder of $x^k \times (x^7 + \ldots + x^2 + x + 1)$ divided (modulo-2) by $G(x)$, where k is the number of bits in the calculation fields, and The remainder after multiplication of the contents (treated as a polynomial) of the calculation fields by $x^8$ and then division by $G(x)$.

The CRC-8 field is transmitted commencing with the coefficient of the highest-order term.

As a typical implementation, at the transmitter, the initial remainder of the division is preset to all ones and is then modified by division of the calculation fields by the generator polynomial $G(x)$. The one's complement of this remainder is transmitted, with the high-order bits first, as the CRC-8 field.

At the receiver, the initial remainder is preset to all ones and the serial incoming bits of the calculation fields and CRC-8, when divided by $G(x)$ in the absence of transmission errors, results in a unique nonzero remainder value. The unique remainder value is the polynomial: $x^7+x^6+x^5+x^4+X+1$.

The CRC-16 is computed using the following standard generator polynomial of degree 16: $G(x)=x^{16}+x^{12}+x^5+1$. The CRC-16 is the one's complement of the (modulo-2) sum of the following:

The remainder of $x^k \times (x^{15}+x^{14}+ \ldots +x^2+x+1)$ divided (modulo-2) by $G(x)$, where k is the number of bits in the calculation fields, and The remainder after multiplication of the contents (treated as a polynomial) of the calculation fields by $x^{16}$ and then division by $G(x)$.

The CRC-16 field is transmitted commencing with the coefficient of the highest-order term.

As a typical implementation, at the transmitter, the initial remainder of the division is preset to all ones and is then modified by division of the calculation fields by the generator polynomial $G(x)$. The one's complement of this remainder is transmitted, with the high-order bits first, as the CRC-16 field.

At the receiver, the initial remainder is preset to all ones and the serial incoming bits of the calculation fields and CRC-16, when divided by $G(x)$ in the absence of transmission errors, results in a unique nonzero remainder value. The unique remainder value is the polynomial: $x^{12}+x^{11}+x^{10}+x^8+x^3+x^2+x+1$ The CRC-32 is computed using the following standard generator polynomial of degree 32: $G(x)=x^{32}+x^{26}+x^{23}+x^{22}+x^{16}+x^{12}+x^{11}+x^{10}+x^8+x^7+x^5+x^4+x^2+x+1$. The CRC-32 is the one's complement of the (modulo-2) sum of the following:

The remainder of $x^k \times (x^{31}+x^{30}+ \ldots +x^2+x+1)$ divided (modulo-2) by $G(x)$, where k is the number of bits in the calculation fields, and The remainder after multiplication of the contents (treated as a polynomial) of the calculation fields by $X^{32}$ and then division by $G(x)$.

The CRC-32 field is transmitted commencing with the coefficient of the highest-order term. As a typical implementation, at the transmitter, the initial remainder of the division is preset to all ones and is then modified by division of the calculation fields by the generator polynomial $G(x)$. The one's complement of this remainder is transmitted, with the high-order bits first, as the CRC-16 field.

At the receiver, the initial remainder is preset to all ones and the serial incoming bits of the calculation fields and CRC-16, when divided by $G(x)$ in the absence of transmission errors, results in a unique nonzero remainder value. The unique remainder value is the polynomial: $x^{12}+x^{11}+x^{10}+x^8+x^3+x^2+x+1$.

Many other implementations of the invention other than those described above are within the invention, which is defined by the following claims.

What is claimed is:

1. A method of operating in a network in which a plurality of stations communicate over a shared medium, comprising
transmitting a group of bits from a transmitting station to a receiving station, wherein the group of bits comprises information bits and error checking bits;
communicating additional bits from the transmitting station to the receiving station without transmitting the additional bits, the communicating of the additional bits comprises
at the transmitting station, deriving the error checking bits from the additional bits using an error checking process; and
at the receiving station, using the same or a related error checking process to process candidate bits known to the receiving station, and comparing the output of the error checking process to the error checking bits received from the transmitting station to determine if the candidate bits correspond to the additional bits.

2. The method of claim 1 wherein the communicating of the additional bits further comprises
at the transmitting station, deriving the error checking bits from the additional bits and the information bits using the error checking process; and
at the receiving station, using the same or a related error checking process to process the candidate bits and the information bits received from the transmitting station, comparing the output of the error checking process result to the error checking bits received from the first station to determine if the candidate bits correspond to the additional bits.

3. The method of claim 1 wherein the additional bits comprise an address identifying one or both of the transmitting and receiving stations.

4. The method of claim 3 wherein the group of bits constitutes a packet, the information bits comprise a source address and data, and the additional bits comprise a destination address identifying the receiving station.

5. The method of claim 3 wherein the group of bits constitutes a packet, the information bits comprise a source address and data, and the additional bits comprise at least a portion of a destination address at least partially identifying the receiving station.

6. The method of claim 3 wherein the group of bits constitutes a Request To Send (RTS), the information bits comprise a source address and data, with the source address identifying the transmitting station, and the additional bits comprise a destination address identifying the receiving station.

7. The method of claim 3 wherein the group of bits constitutes a RTS, the information bits comprise a source address and data, with the source address identifying the transmitting station, and the additional bits comprise at least a portion of a destination address at least partially identifying the receiving station.

8. The method of claim 3 wherein the group of bits constitutes a Clear To Send (CTS) transmitted in response to an RTS, and the additional bits comprise one or both of the following: (1) a destination address identifying the receiving station and (2) a source address identifying the transmitting station.

9. The method of claim 3 wherein the group of bits constitutes an acknowledgement, and the additional bits comprise one or both of the following: (1) a source address identifying the transmitting station and (2) a destination address identifying the receiving station.

10. The method of claim 3 wherein the group of bits constitutes an acknowledgement and the additional bits comprise one or both of the following: (1) at least a portion of a source address at least partially identifying the transmitting station and (2) at least a portion of a destination address at least partially identifying the receiving station.

11. The method of claim 3 wherein the group of bits constitutes an acknowledgement transmitted in response to a receipt of a packet, and the additional bits comprise a set of bits from the packet that is sufficiently unique as to associate the acknowledgement with the packet.

12. The method of claim 6 wherein the information bits comprise bits indicating which portions of a previously transmitted packet need to be retransmitted.

13. The method of claim 1 wherein the error checking process comprises a cyclic redundancy check, and the error checking bits comprise frame check sequence (FCS) bits associated with the cyclic redundancy check.

\* \* \* \* \*

UNITED STATES PATENT AND TRADEMARK OFFICE
CERTIFICATE OF CORRECTION

PATENT NO. : 7,281,187 B2 Page 1 of 1
APPLICATION NO. : 10/720016
DATED : October 9, 2007
INVENTOR(S) : Lawrence W. Yonge, III and Srinivas Katar It is certified that error appears in the above-identified patent and that said Letters Patent is hereby corrected as shown below:

On the Title Page, Item (54) Title, "Communicated" should be -- Communicate --.
On the Title Page page 3, Item (56) References Cited, U.S. PATENT DOCUMENTS, 2005/0122994 "Manglin et al." should be -- Mangin et al. --.
Col. 1, line 2, "Communicated" should be -- Communicate --.
Col. 2, delete lines 32-34.
Col. 2, line 43, after "unique number", delete "or number".
Col. 4, line 52, "on" should be -- one --.
Col. 4, line 30, after "block", insert -- of --.
Col. 6, line 25, after "with", insert -- the --.
Col. 7, line 25, "X" should be -- x --.
Col. 7, line 50, after "1", insert a period.

Signed and Sealed this

Eighteenth Day of November, 2008

JON W. DUDAS
*Director of the United States Patent and Trademark Office*